United States Patent [19]

Billig et al.

[11] Patent Number: 5,515,027
[45] Date of Patent: May 7, 1996

[54] TEST CIRCUIT FOR DETECTION OF MALFUNCTIONS IN AN ELECTRIC TRIGGERING DEVICE

[75] Inventors: Jan Billig, Göteborg; Göran Svedoff, Billdal, both of Sweden

[73] Assignee: AB Volvo, Sweden

[21] Appl. No.: 64,086

[22] PCT Filed: Sep. 19, 1991

[86] PCT No.: PCT/SE91/00361

§ 371 Date: Jun. 2, 1993

§ 102(e) Date: Jun. 2, 1993

[87] PCT Pub. No.: WO92/01461

PCT Pub. Date: Jun. 11, 1992

[30] Foreign Application Priority Data

Nov. 23, 1990 [SE] Sweden .................................. 9003728

[51] Int. Cl.[6] ..................................................... B60Q 1/00
[52] U.S. Cl. ....................... 340/438; 340/436; 280/734; 280/735; 307/10.1; 180/271; 180/282; 364/424.05
[58] Field of Search ................................ 340/438, 436, 340/511, 514, 516, 663, 665, 635; 280/728 R, 735, 734; 307/10.1, 121; 180/274, 271, 282; 364/424.05 R; 324/161

[56] References Cited

U.S. PATENT DOCUMENTS

| | | | |
|---|---|---|---|
| 4,016,426 | 4/1977 | Nishioka | 340/438 |
| 4,143,264 | 3/1979 | Gilbert et al. | 340/438 |
| 4,673,912 | 6/1987 | Kumasaka et al. | 340/438 |
| 4,893,109 | 1/1990 | Vrabel et al. | 340/438 |
| 4,945,336 | 7/1990 | Itoh et al. | 340/438 |
| 4,956,631 | 9/1990 | Itoh | 340/436 |
| 5,081,442 | 1/1992 | Ito et al. | 340/438 |
| 5,155,376 | 10/1992 | Okauo | 340/438 |
| 5,166,880 | 11/1992 | Furui | 340/436 |

OTHER PUBLICATIONS

U. Tietze Ch. Schenk, Halbleiter–Schaltungstechnik, 1983 pp. 352–353.

*Primary Examiner*—Brent A. Swarthout
*Assistant Examiner*—Nina Tong
*Attorney, Agent, or Firm*—Lerner, David, Littenberg, Krumholz & Mentlik

[57] ABSTRACT

A test circuit for detection of malfunctions in an electric triggering device (10, 11) for protection of vehicle occupants. The triggering devices (10, 11) are arranged with a first connector (12) connected to earth (13) and a second connector (14) connected to a control unit for supply of a triggering current to the triggering devices when detecting a triggering condition. The test circuit comprises a voltage regulator (17), a current generator (18,19) connected in series between the voltage regulator and the connection of the triggering devices (10,11) to the control unit for generating a test current to the triggering devices, and two voltage comparators (24,25) connected between the earth connection (13), the connection (14) to the control unit and the voltage regulator for detecting the voltage across the triggering devices (10,11).

4 Claims, 1 Drawing Sheet

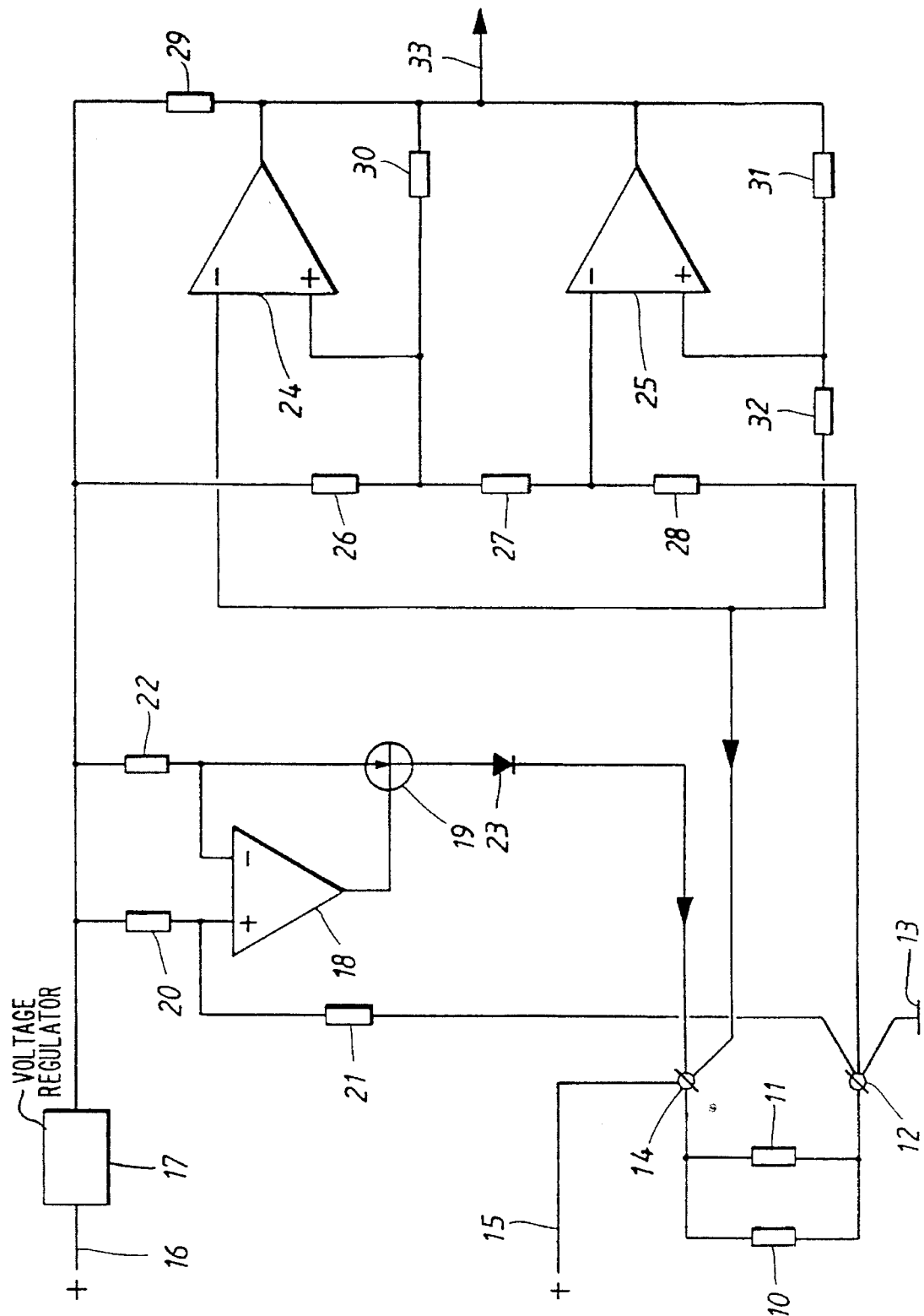

5,515,027

TEST CIRCUIT FOR DETECTION OF MALFUNCTIONS IN AN ELECTRIC TRIGGERING DEVICE

TECHNICAL FIELD

The present invention relates to a test circuit for detection of malfunctions in an electric triggering device for protection of vehicle occupants, in which the triggering devices are arranged with a first connector connected to earth and a second connector connected to a control unit for supply of a triggering current to the triggering devices when detecting a triggering condition.

BACKGROUND OF THE INVENTION

Triggering devices according to the above are used i.e. in motor vehicles for activating so-called air bags, i.e inflatable air cusions which protect the driver and passanger in the event of an accident. It is important that the condition of these triggering devices is continuously monitored so that they actually function if an accident should occur. One problem is that the resistance of various common triggering devices can vary between 1.80 and 2.50 $\Omega$. For example, a normal tolerance zone in an application with two triggering devices connected in parallel can lie between 0.9 and 1.25 $\Omega$, outside of which range an error must be indicated.

Several test circuits for continuous monitoring of triggering devices are known. Because of the problem of the large tolerance zone of the resistance of the triggering device, use has been made of circuits in which voltage division takes place across the resistance and with detection of changes in resistance. For example, U.S. Pat. No. 4,016,426 describes test circuits which include a plurality of diodes, transistors and other electrical components. The complicated construction is due partly to the fact that the current must be limited so that the triggering devices will not be activated by the test current. This implies that the arrangement is relatively expensive to manufacture.

OBJECT OF THE INVENTION

It is therefore an object of the present invention to provide a simple, cheap and reliable test circuit.

SOLUTION

This object is achieved according to the present invention in that the test circuit comprises a voltage regulator, a current generator connected in series between the voltage regulator and the connection of the triggering devices to the control unit for generating a test current to the triggering devices, and two voltage comparators connected between the earth connection, the connection to the control unit and the voltage regulator for detecting the voltage across the triggering devices.

Preferred embodiments of the invention are detailed in the dependent claims.

BRIEF DESCRIPTION OF THE DRAWINGS

One embodiment of the invention will now be described in more detail with reference to the attached drawing which schematically illustrates the test circuit according to the invention.

BEST MODE OF CARRYING OUT THE INVENTION

A triggering device for a so called air bag is provided with a hot-wire whose function is to ignite a powder charge. Error in the triggering device is indicated if its resistance deviates from a resistance range. Usually two triggering devices connected in parallel in a circuit are used. The triggering of the two triggering devices occurs in parallel via a common detector. In the following, a test circuit is described in an application with two parallel connected triggering devices.

In the drawing, reference numerals 10 and 11 denote the two parallel-connected triggering devices which are arranged with a first connection 12 connected to earth 13 and a second connection 14 connected via a lead 15 to a control unit for detecting a triggering condition. The control unit is connected to the positive terminal of the vehicle's battery (not shown).

A second lead 16 connects a voltage regulator 17 via the ignition lock to the previously mentioned battery's +ve terminal and provides voltage to a current generator which comprises an operational amplifier 18 and a current amplifier 19 (transistor).

The current generator receives a suitable reference potential in a potential divider formed by two resistors 20, 21 which in turn is supplied from the voltage regulator 17. The operational amplifier 18 with additional current amplification from the amplifier 19 gives a correct test current by means of the choice of resistance of the resistor 22. The diode 23 serves to prevent reverse current flow through the circuit during activation of the triggering devices via the lead 15.

The voltage comparators 24 and 25 are connected such that an error is indicated if the resistance between the points 12 and 14 is too great or too small. The resistors 26, 27 and 28 give the two reference potentials and the resistors 30, 31 and 32 are included in the positive feed-back coupling for distinct detection. The resistor 29 is a "pull-up" resistor when the voltage comparators 24, 25 present "open-collector" output.

The voltage comparator 24 indicates an error in the case of too high a voltage whilst the voltage comparator indicates an error when the voltage is too low. The error signal is attained at 33 as an output voltage.

In a preferred embodiment of the invention, the maximum test current through the triggering devices is 40 mA. The parallel connection of the two triggering devices means that the resistance between the points 12 and 14 ought to lie between 0.90 and 1.25 $\Omega$. At this low resistance a voltage of approximately 40 mV is attained. This low voltage is sufficient for the monitoring of the triggering devices, though not so high that they are activated.

The invention is not restricted to the above-described embodiment, but may be varied within the scope of the appended claims.

We claim:

1. A test circuit for detection of malfunctions in electronic triggering devices for protection of vehicle occupants, comprising:

two or more of triggering devices connected in parallel, said triggering devices arranged with a first connector connected to ground and a second connector connected to a control unit for supplying a triggering current to said triggering devices upon detection of a triggering condition;

a voltage regulator for supplying a constant reference voltage;

a current generator for generating a constant current connected in series between said voltage regulator and said second connector for generating a test current to said triggering devices; and two voltage comparators connected between ground, said second connector and said voltage regulator for detecting the voltage across said triggering devices.

2. A test circuit as claimed in claim 1, wherein said current generator includes an operational amplifier and a current amplifier.

3. A test circuit as claimed in claim 2, further comprising a diode arranged between said current amplifier and said second connector.

4. A test circuit as claimed in claims 2 or 3, further comprising at least one resistor connected between said voltage regulator and said current generator, said resistor being selected so that each of said triggering devices can be subjected to said test current of approximately 40 mA.

* * * * *

UNITED STATES PATENT AND TRADEMARK OFFICE
CERTIFICATE OF CORRECTION

PATENT NO. : 5,515,027
DATED : May 7, 1996
INVENTOR(S) : Billig et al.

It is certified that error appears in the above-identified patent and that said Letters Patent is hereby corrected as shown below:

On the title page, item:

[87] PCT Pub. No.:, "WO92/01461", should read --WO 92/09461--.

Column 2, line 19, "+ve" should read --positive--.

Signed and Sealed this

Thirteenth Day of August, 1996

Attest:

BRUCE LEHMAN

Attesting Officer     Commissioner of Patents and Trademarks